(12) United States Patent
Kishigami et al.

(10) Patent No.: US 10,313,152 B2
(45) Date of Patent: Jun. 4, 2019

(54) TRANSMISSION CIRCUIT

(71) Applicant: DENSO CORPORATION, Kariya, Aichi-pref. (JP)

(72) Inventors: Tomohisa Kishigami, Kariya (JP); Shuichi Nakamura, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/662,535

(22) Filed: Jul. 28, 2017

(65) Prior Publication Data

US 2018/0041361 A1    Feb. 8, 2018

(30) Foreign Application Priority Data

Aug. 2, 2016    (JP) ................. 2016-151927

(51) Int. Cl.
| | | |
|---|---|---|
| *H04L 12/46* | (2006.01) | |
| *H03F 3/24* | (2006.01) | |
| *H04B 3/54* | (2006.01) | |
| *H04J 3/22* | (2006.01) | |
| *H04L 25/02* | (2006.01) | |
| *H04L 12/40* | (2006.01) | |

(52) U.S. Cl.
CPC .......... *H04L 12/4625* (2013.01); *H03F 3/24* (2013.01); *H04B 3/542* (2013.01); *H04B 3/548* (2013.01); *H04J 3/22* (2013.01); *H04L 12/40045* (2013.01); *H04L 25/0272* (2013.01); *H04B 2203/547* (2013.01); *H04B 2203/5408* (2013.01); *H04L 2012/40215* (2013.01)

(58) Field of Classification Search
None
See application file for complete search history.

(56) References Cited

U.S. PATENT DOCUMENTS

| 5,781,585 A * | 7/1998 | Dorner .................. H04L 43/00 327/64 |
|---|---|---|
| 7,242,227 B2 * | 7/2007 | Pauletti ............... H04L 25/0284 327/112 |
| 10,127,186 B2 * | 11/2018 | Walker ................ H04L 25/0274 |
| 2003/0145121 A1 * | 7/2003 | Watkins ................ G06F 13/385 709/250 |
| 2006/0160511 A1 * | 7/2006 | Trichy ................ G06F 13/4072 455/255 |
| 2013/0294460 A1 | 11/2013 | Hell |
| 2013/0294540 A1 * | 11/2013 | Hell ................... H04L 25/0272 375/295 |
| 2014/0156893 A1 * | 6/2014 | Monroe ............... G06F 13/372 710/117 |

(Continued)

Primary Examiner — Michael J Moore, Jr.
(74) Attorney, Agent, or Firm — Posz Law Group, PLC

(57) ABSTRACT

A transmission circuit includes a first transmitter and a second transmitter. The first transmitter turns OFF first transistors when a transmission data is in a high level, and turns ON the first transistors when the transmission data is in a low level. When a permission signal is in the high level, the second transmitter turns ON the second transistors when the transmission data is in the high level, and turns OFF the second transistors when the transmission data is in the low level. Diodes are set to suppress an amplitude of a differential signal in an ON time of the second transistors more than an amplitude of a differential signal in an ON time of the first transistors, to suppress ringing and radiation noise.

7 Claims, 4 Drawing Sheets

(56) References Cited

U.S. PATENT DOCUMENTS

| | | | | |
|---|---|---|---|---|
| 2014/0330996 A1* | 11/2014 | de Haas | ............... | G06F 13/4031 710/106 |
| 2014/0365693 A1* | 12/2014 | Monroe | ................ | G06F 13/385 710/105 |
| 2015/0095532 A1* | 4/2015 | Muth | .................. | G06F 13/4072 710/105 |
| 2015/0095711 A1* | 4/2015 | Elend | .................... | G06F 11/221 714/39 |
| 2016/0036604 A1* | 2/2016 | Mori | .................. | H04L 25/0292 375/296 |
| 2016/0234038 A1* | 8/2016 | Mounier | ........... | H04L 12/40032 |

* cited by examiner

TRANSMISSION CIRCUIT

CROSS REFERENCE TO RELATED APPLICATION

The present application is based on and claims the benefit of priority of Japanese Patent Application No. 2016-151927, filed on Aug. 2, 2016, the disclosure of which is incorporated herein by reference.

TECHNICAL FIELD

The present disclosure generally relates to a transmission circuit that transmits a differential signal.

BACKGROUND INFORMATION

Communication systems using a CAN protocol are known. CAN, or Controller Area Network, is a registered trademark. Communication systems implementing the CAN protocol transmit both a dominant signal and a recessive signal via a transmission line. For example, a dominant signal may be transmitted to indicate that one of the drivers connected to the transmission line is in a drive state and that the transmission line has a low impedance. On the other hand, when the recessive signal is transmitted via the transmission line, all the drivers connected to the transmission line are in a non-drive state, which means that the transmission line has a high impedance. Therefore, a ringing may be generated when transitioning from a drive state to a non-drive state, i.e., when transitioning from the low impedance state to the high impedance state, or when changing from a dominant to a recessive signal. Communication speed affects ringing, with ringing having a greater, more influential effect on high speed communications.

A CAN-FD protocol (Controller Area Network with Flexible Data rate) is an expansion of the CAN protocol. According to the CAN-FD protocol, a CAN frame transmitted and received by the drivers has, or is divided into, an arbitration field and a non-arbitration field. The arbitration field is used for a bus arbitration, i.e. to arbitrate multiple communication signals on a communication line, and the non-arbitration field (i.e., the data field) is transmitted at a higher communication speed than the arbitration field.

The patent document 1 listed below discloses a ringing suppression method in the non-arbitration field for high speed communications, using a drive method that drives the driver to generate a reverse-polarity differential voltage on the transmission line during a recessive signal output. The polarity of the recessive output signal is the opposite of the polarity for the dominant signal. In other words, when the recessive signal is output, the driver is put in a drive state instead of a non-drive state, for lowering the impedance of the transmission line to suppress the ringing.

(Patent document 1) Publication of US 2014/0330996 A1

However, the conventional technique for suppressing the ringing in the above-described patent document 1 is problematic, because it increases the amplitude of the differential signal. That is, in the conventional technique, the normal signal amplitude, or a level difference between the dominant signal and the recessive signal, doubles when the drive method is employed to suppress the ringing, thereby increasing a radiation noise from the transmission line.

SUMMARY

It is an object of the present disclosure to provide a transmission circuit that prevents or suppresses both of the ringing and the radiation noise conventionally caused on the transmission line.

In an aspect of the present disclosure, the transmission circuit includes: a first transmitter and a second transmitter.

The first transmitter may transmit a differential signal to a transmission line in a switching manner, i.e., by switching (i) a drive state for supplying an electric power to the transmission line and (ii) a non-drive state to interrupt a supply of the electric power to the transmission line, based on a binary-represented transmission signal.

The second transmitter also transmits the differential signal to the transmission line in a switching manner, during a drive state, by supplying an electric power during a dominant period when the first transmitter is in the non-drive state, and during a non-drive state, by interrupting an electric power supply during a recessive period when the first transmitter is in the drive state. The second transmitter switching between the drive state and the non-drive state may output a differential signal in the recessive period with a smaller amplitude and a reverse polarity relative to an amplitude and a polarity of a differential signal output in the dominant period by the first transmitter.

According to the configuration described above, the amplitude of the differential signal is controlled to be smaller than the conventional device with the impedance of the transmission line kept at a low level in the recessive period. As a result, the ringing conventionally generated during switching from the recessive period to the dominant period is suppressed together with radiation noise from the transmission line.

BRIEF DESCRIPTION OF THE DRAWINGS

Objects, features, and advantages of the present disclosure will become more apparent from the following detailed description made with reference to the accompanying drawings, in which.

DETAILED DESCRIPTION

Hereafter, an embodiment of the present disclosure is described, with reference to the drawings.

1. Configuration

Figure 1:
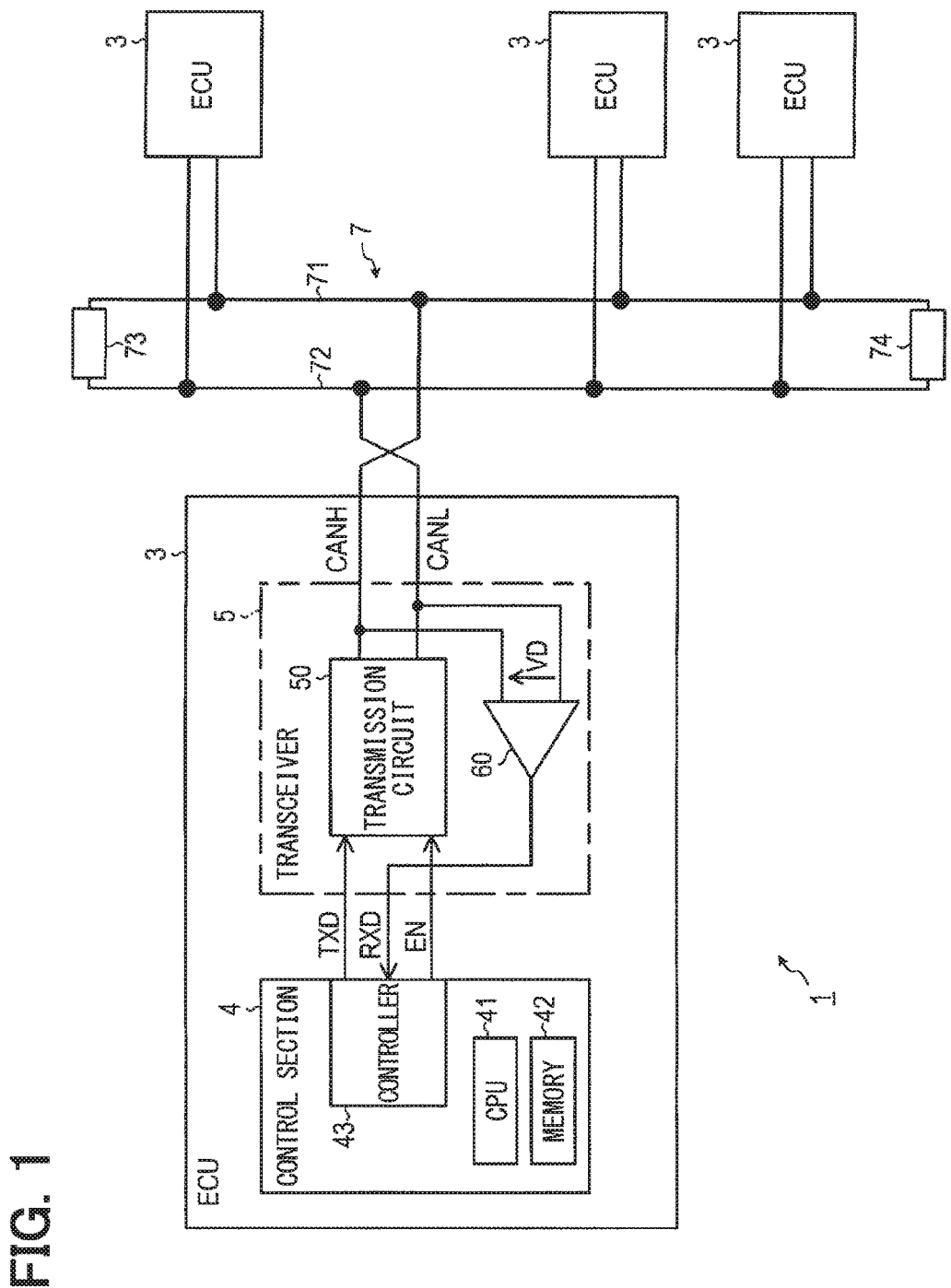
FIG. 1 illustrates a block diagram of a communications system in an embodiment of the present disclosure.

With reference to FIG. 1, a communication system 1 is provided with two or more electronic control units (ECUs) 3. The communication system 1 uses a transmission line 7 to connect multiple ECUs 3 with each other. The communication system 1 with ECUs 3, for example, may be used in a vehicle to provide communication between a plurality of ECUs 3.

Each of the ECUs 3 transmits and receives various types of information, i.e. data, via electrical signals over the transmission line 7 by operating according to a CAN-FD protocol, and each of the ECUs 3 performs various processes according to the information obtained from the communication, for example, to implement a function assigned to each of the ECUs 3. As used herein, communication signals or "signals" may refer to electrical signals such as transmissions signals (TXD), reception signals (RXD), permission signals (EN), differential signals, and the like. Signals may be transmitted via communication lines, for example, transmission line 7, though transmission of signals is not limited to transmission line 7. As used herein, data and signals may be used interchangeably to refer to information transmitted and received by each of the ECUs 3.

A communication frame ("CAN-FD frame," as used herein) is in accordance with the CAN-FD protocol and includes an arbitration field and a non-arbitration field. The bit rate set for the arbitration field in the CAN-FD frame is the same bit rate as the conventional CAN frame, for example, 500 kbit/s.

On the other hand, the bit rate of the non-arbitration field may be set to a higher rate than the arbitration field, which may be set, for example, by selection, to a maximum rate of 5 Mbit/s.

In the arbitration field, or more practically during an arbitration phase, when the transmission signals from the multiple ECUs 3 collide, an arbitration is performed to determine a winning ECU 3, and during a data phase, the data from the ECU 3 winning the arbitration is transmitted. As described herein, the arbitration field may also be designated as a low speed field, and the non-arbitration field may also be designated as a high speed field. Signals designated as arbitration field signals may be transmitted/ received in the arbitration field, i.e. the low speed field. Likewise, signals designated as non-arbitration field signals may be transmitted/received in the non-arbitration field, i.e. the high speed field. Signals transmitted may be transmitted in both the arbitration field and the non-arbitration field. For example, a portion of a signal can be transmitted in the arbitration field and another portion of the signal can be transmitted in the non-arbitration field.

2. Transmission Line

The transmission line 7 is a bus-like line which includes a pair of signal wires 71 and 72 for transmitting a differential signal. The transmission line 7 has termination circuits 73 and 74 on both ends of the transmission line 7 for controlling signal reflection and bounce. As described herein, one of the signal wires 71 or 72 may be designated as CANH, with the other one of the signal wires 71 or 72 designated as CANL. For example, signal wire 71 is designated as CANH and signal wire 72 is designated as CANL.

3. ECU

The ECU 3 includes a control section 4 and a transceiver 5.

The control section 4 may be a microcomputer or like computing device that may include a CPU 41 and other components such as a semiconductor memory ("memory") 42, such as, for example, a RAM, a ROM, a flash memory, and the like.

The control section 4 includes a communication controller 43 that performs communication in accordance with the CAN-FD protocol.

The communication controller 43 provides the transceiver 5 with, (i) transmission data TXD representing a CAN-FD frame, and (ii) a permission signal EN that is transmitted synchronously with the transmission data TXD. The permission signal EN is a low level signal in the low speed field, i.e. the arbitration field, and a high level signal in the high speed field, i.e. the data field.

The communication controller 43 receives reception data RXD from the transceiver 5, and extracts data from a data field when the reception data RXD is a normal CAN-FD frame in accordance with the CAN-FD protocol. The term "normal" means, for example, a standard CAN-FD frame, in terms of normal-abnormal context, and in terms of the frame arrangement complying with the CAN-FD standard/protocol.

As used herein, any of the transmission data (TXD), permission signal (EN), and reception data (RXD) may be represented as a binary signal. For example, the transmission data (TXD) can be a binary-represented transmission signal.

The CPU 41 performs a transmission process for transmitting data to the communication controller 43, then to transceiver 5, for the data to be further provided to other ECU 3 via transmission line 7. The CPU 41 also performs a reception process for performing the various processes associated with the data received by the communication controller 43.

4. Transceiver

The transceiver 5 is provided with a transmission circuit 50 and a reception circuit 60.

The reception circuit 60 determines a signal level, i.e. low or high, of a differential signal received from the transmission line 7 based on a preset threshold voltage Vth. For example, a differential signal having a voltage below threshold voltage Vth, (i.e., differential signal voltage≤Vth), is a low level signal, and a differential signal voltage above the threshold voltage Vth, (i.e., differential signal voltage>Vth), is a high level signal. After determining the differential signal level, i.e. low or high, the reception circuit 60 provides the result to the communication controller 43 as a reception data RXD. In accordance with the CAN standard, the reception threshold voltage Vth is set at 0.7 V. As used herein, a level of a signal, i.e. signal level, may refer to a high or low signal state, i.e., a high level signal. A "high level" and "low level" designation of a signal does not limit a signal based on the voltage level of the signal relative to a threshold voltage, but may instead refer to a logic level of a digital signal. For example, using binary notation, a signal corresponding to a binary "1" can be referred to as a high level signal using an active-high representation. Signal level may also refer to the voltage level of a signal. For example, a differential signal with a signal level of 2 V.

Figure 2:
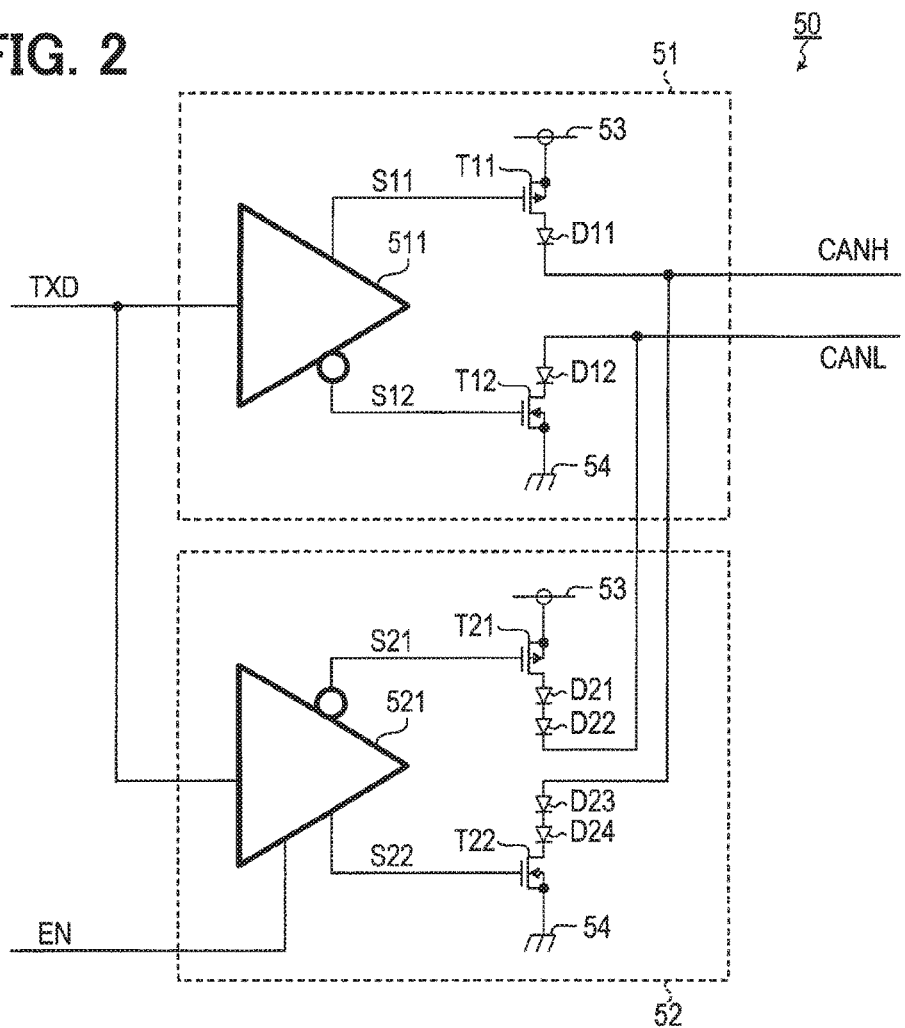
FIG. 2 illustrates a circuit diagram of a transmission circuit.

With reference to FIG. 2, the transmission circuit 50 includes a first transmitter 51 and a second transmitter 52.

The first transmitter 51 has a first driver circuit 511, transistors T11 and T12, and diodes D11 and D12.

The transistor T11 is a P-channel type field-effect transistor, and has a source connected to a power source line 53 supplying a direct current (DC) voltage VDD.

The transistor T12 is an N-channel type field-effect transistor, and has a source connected to a ground line 54.

The diode D11 has an anode connected to a drain of the transistor T11, and has a cathode connected to CANH.

The diode D12 has an anode connected to CANL, and has a cathode connected to a drain of the transistor T12.

The first driver circuit 511 generates a non-inverted output S11 at the same signal level as the transmission data TXD, and also generates an inverted output S12 of the transmission data TXD, according to the transmission data TXD.

Figure 3:
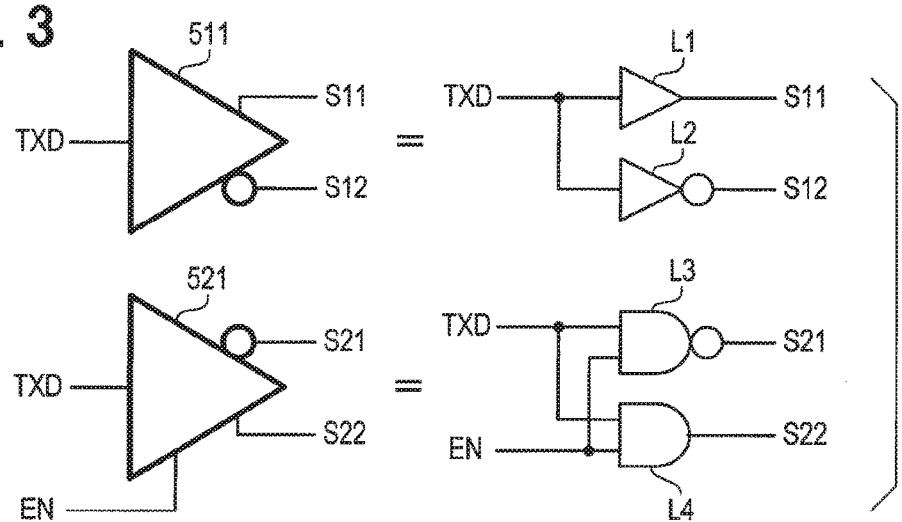
FIG. 3 illustrates equivalent circuits for dominant and recessive drivers.

With reference to FIG. 3, the first driver circuit 511 may include a buffer circuit L1 and an inverter circuit L2. Further, the non-inverted output S11 may be applied to a gate of the transistor T11, and the inverted output S12 may be applied to a gate of the transistor T12.

That is, when the transmission data TXD is in a high level, both of the transistors T11 and T12 are turned OFF, i.e., transistors T11 and T12 have high impedance when off, and as a result, no electric power is supplied from the first transmitter 51 to the transmission line 7, i.e. CANH and CANL.

On the other hand, when the transmission data TXD is in a low level, both of the transistors T11 and T12 are turned ON, and electric power is supplied from the first transmitter 51 to the transmission line 7.

With reference again to FIG. 2, the second transmitter 52 has a second driver circuit 521, transistors T21 and T22, diodes D21, D22, D23, and D24.

The transistor T21 is a P-channel type field-effect transistor, and has a source connected to the power source 53 supplying DC voltage VDD.

The transistor T22 is an N-channel type field-effect transistor, and has a source connected to the ground line 54.

The diodes D21 and D22 are connected in series, and an anode side of the series connection of the diodes D21/D22 is connected to a drain of the transistor T21, and a cathode side of the series connection of the diodes D21/D22 is connected to CANL.

The diodes D23 and D24 are also connected in series, and an anode side of the series connection of the diodes D23/D24 is connected to CANH, and a cathode side of the series connection of the diodes D23/D24 is connected to a drain of the transistor T22.

The second driver circuit 521 generates an inverted output S21 and a non-inverted output S22 based on the transmission data TXD and the permission signal EN.

More practically, when the permission signal EN is in a high level, the inverted output S21 generates an output with a high level when the transmission data TXD is at a low level, and an output with a low level when the transmission data TXD is at a high level. When the permission signal EN is in a high level, the non-inverted output S22 will output an output with a low level when the transmission data TXD is at a low level, and output an output with a high level when the transmission data TXD is at a high level.

When the permission signal EN is in a low level, the output of the inverted output S21 is in a high level and the output of the non-inverted output S22 is in a low level, regardless of the signal level of the transmission data TXD.

With reference to FIG. 3, the second driver circuit 521 may include, a NAND circuit L3 and an AND circuit L4.

With reference again to FIG. 2, the inverted output S21 may be applied to a gate of the transistor T21, and the non-inverted output S22 may be applied to a gate of the transistor T22.

5. Operation

In the description below, a high level period of the transmission data TXD is designated as a recessive period, and a low level period of the transmission data TXD is designated as a dominant period. An ON voltage of the transistors T11, T12, T21, and T22 is designated as an ON voltage Von, and a forward voltage of the diodes D11, D12, D21-D24 is designated as a forward voltage Vf.

[5-1. Operation in a Low Speed Field]

The communication controller 43 outputting the permission signal EN in the low level, i.e., in a low speed field, is described in greater detail below.

Figure 4:
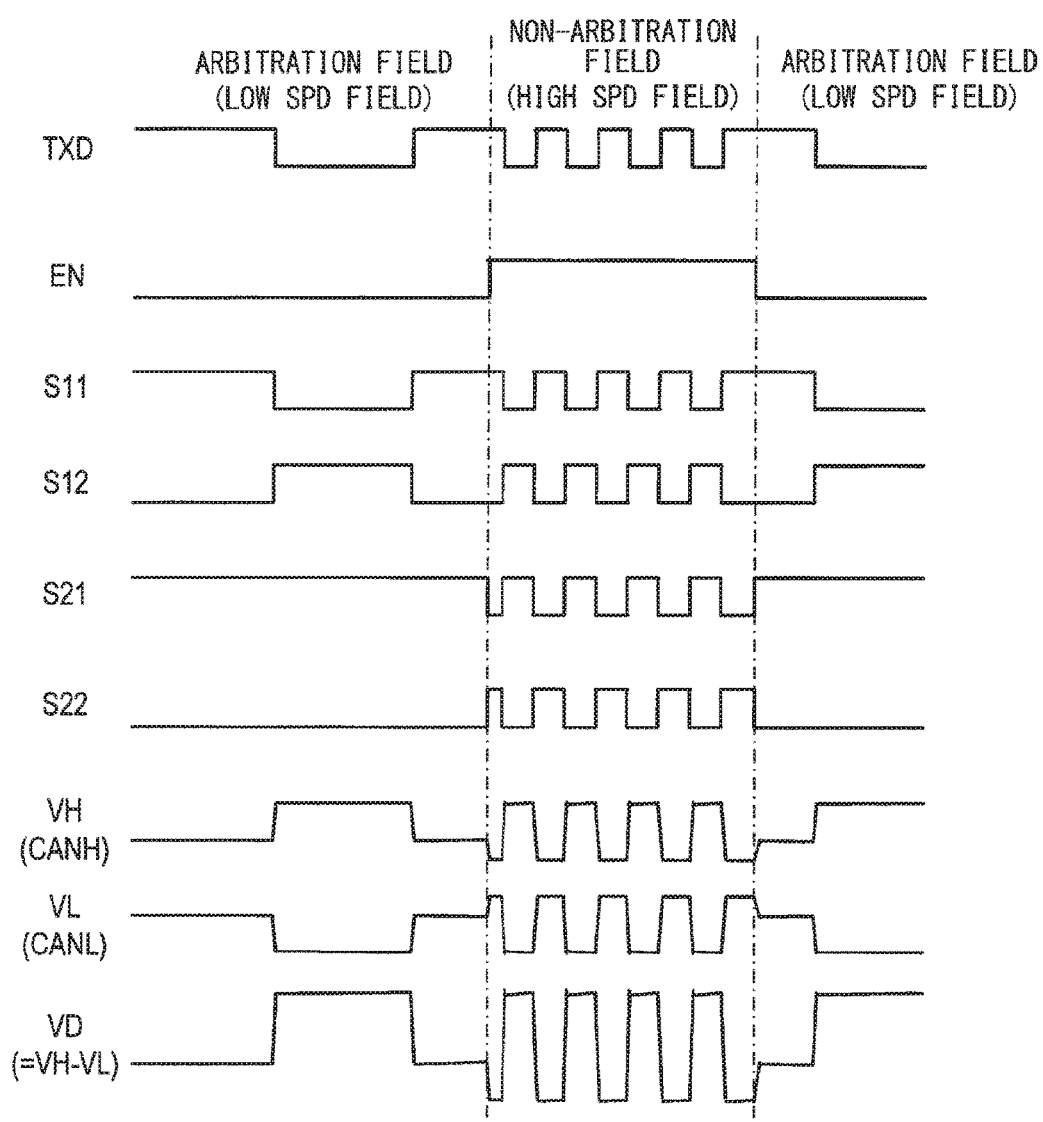
FIG. 4 illustrates a timing diagram of a transmission circuit operation.

As shown in FIG. 4, in the low speed field, regardless of the signal level of the transmission data TXD, each of the transistors T21 and T22 in the second transmitter 52 is turned OFF. Therefore, in the low speed field, the signal level of CANH and CANL, as well as the signal level of the differential signal transmitted via the transmission line 7, are all determined by the first transmitter 51.

When the transmission data TXD is in the high level, i.e., in a recessive period, each of the transistors T11 and T12 is turned OFF, and neither the first transmitter 51 nor the second transmitter 52 supplies electric power to the transmission line 7.

Since CANH and CANL are connected via the termination circuits 73 and 74 as shown in FIG. 1, a potential VH of CANH and a potential VL of CANL take the same potential (i.e., VH=VL). As used herein, potential may be used interchangeably with voltage or voltage level. As a result, a signal level DV, as calculated using equation 1, is 0 V $$DV=VH-VL \quad \text{(Equation 1)}$$

On the other hand, in a dominant period where the transmission data TXD is in the low level, each of the transistors T11 and T12 is turned ON and electric power is supplied from the first transmitter 51 to the transmission line 7. At such moment, a potential VH of CANH represented by an equation 2 is about 3.5 V, and a potential VL of CANL represented by an equation 3 is about 1.5 V. As a result, the signal level DV of the differential signal represented by the equation 1 is about 2 V.

$$VH=VDD-Von-Vf \quad \text{(Equation 2)}$$

$$VL=0+Von+Vf \quad \text{(Equation 3)}$$

[5-2. Operation in a High Speed Field]

The communication controller 43 outputting the permission signal EN in the high level, i.e., in a high speed field, is described in greater detail below. In the high speed field, the first transmitter 51 and the second transmitter 52 operate based on the signal level of the transmission data TXD.

When the transmission data TXD is in the high level, i.e., in a recessive period, each of the transistors T11 and T12 is turned OFF and each of the transistors T21 and T22 is turned ON. Therefore, the potential of CANH and CANL is determined by the supply of electric power to the transmission line 7 from the second transmitter 52.

More practically, a potential VH of CANH is represented by equation 4, and is about 2.2 V, and a potential VL of CANL is represented by equation 5, and, is about 2.8 V. As a result, the signal level DV of the operation signal represented by the equation 1 is about −0.6 V.

$$VH=0+Von+2\times Vf \quad \text{(Equation 4)}$$

$$VL=VDD-Von-2\times Vf \quad \text{(Equation 5)}$$

On the other hand, when the transmission data TXD is in the low level, i.e., in a dominant period, each of the transistors T11 and T12 is turned ON and each of the transistors T21 and T22 is turned OFF. Therefore, the potential of CANH and CANL is determined by the supply of electric power to the transmission line 7 from the first transmitter 51.

The signal level DV of the differential signal is about 2 V, as the communication controller 43 operates the same for the dominant period in both the low and high speed fields, as described above, with the VH and VL voltages calculated using equations 2 and 3, respectively.

Figure 5:
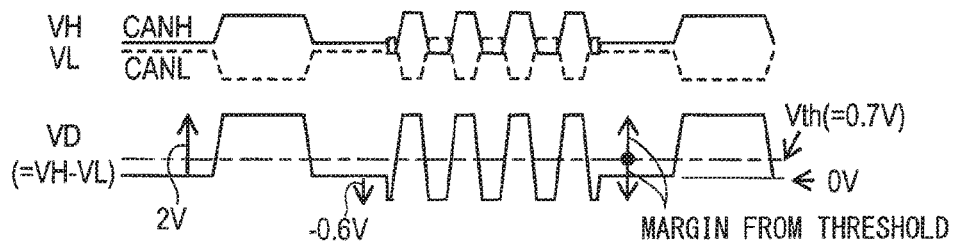
FIG. 5 illustrates a relationship between a waveform of a differential signal and a reception threshold in the embodiment of the present disclosure.

Thus, the differential signal in the low speed field is about 2 V in the dominant period, and is about 0 V in the recessive period, which sets the differential signal amplitude at about 2 V. Further, in the high speed field, the differential signal is about 2 V in the dominant period, and is about −0.6 V in the recessive period, which sets the peak-to-peak amplitude of the differential signal at about 2.6 V. Therefore, the waveform of the differential signal in the high speed field is symmetrical with respect to the reception threshold voltage Vth of 0.7 V. That is, the reception threshold voltage of 0.7 V is the midpoint between the highest amplitude, i.e. 2 V, and the lowest amplitude, i.e. −0.6 V of the differential signal waveform output in the high speed field, as illustrated in FIG. 5.

6. Effects

For the communication system 1 described in detail above, the following effects are achieved.

In the high speed field, i.e., data field, the second transmitter 52 causes the transmission data TXD to take the high level, and electric power is supplied to the transmission line 7 even in the recessive period. Accordingly, the impedance of the transmission line 7 in the recessive period is lowered, and the ringing generated during the transition from a dominant period to a recessive period is reduced.

During operation of the first and second transmitters 51 and 52 in the high speed field, i.e. the data field, the amplitude DV of the differential signal in the recessive period is suppressed more than the amplitude DV of the differential signal in the dominant period. As compared to the conventional technique that does not control the amplitude of the differential signal in the recessive period of the high speed field, the communication system 1, in the embodiments described above, suppresses the amplitude of the differential signal in the recessive period of the high speed field, thereby reducing a radiation noise.

Figure 6:
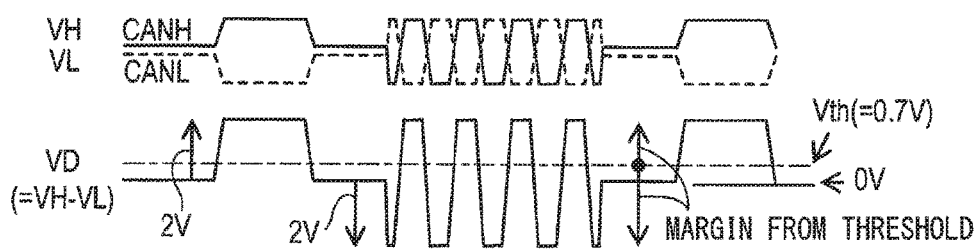
FIG. 6 illustrates a relationship between a waveform of a differential signal and a reception threshold of a conventional device.

With reference to FIG. 6, the waveform of the differential signal for the conventional technology that does not control the amplitude is illustrated, for comparison.

During operation of the first and second transmitters 51 and 52 in the high speed field, the amplitude of the differential signal in the recessive period is set to be symmetric to the amplitude of the differential signal in the dominant period with respect to the reception threshold voltage Vth. In other words, the differential waveform VD is symmetric about the reception threshold voltage Vth. Therefore, on the receiver side, pulse width distortion for the reception data RXD is suppressed without a change to the reception threshold voltage Vth in the high and low speed fields. The reception data RXD with suppressed pulse width distortion is generated by the reception circuit 60 and supplied to the controller 43.

This means that a receiver operating in accordance with the conventional CAN standard is usable as is, without change, in the communication system 1.

Figure 7:
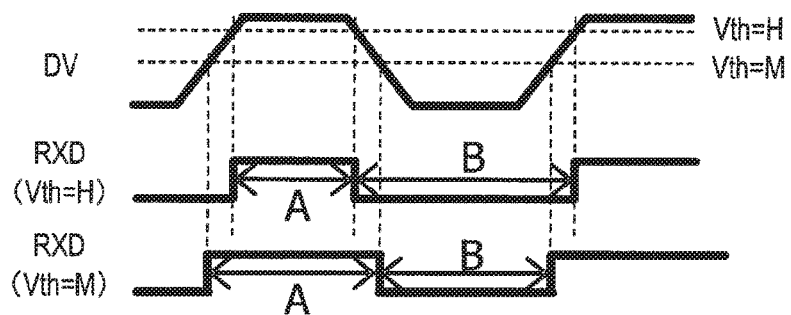
FIG. 7 illustrates a relationship between the reception threshold and a pulse width distortion of a reception data.

In other words, as shown in FIG. 7, when the reception threshold Vth stands at the center of the amplitude of the differential signal (i.e., Vth=M), a pulse width A at the high level time and a pulse width B at the low level time will be almost equal to each other.

However, a shift of the reception threshold voltage Vth away from the midline, i.e., Vth=M, as shown, for example, when Vth=H, shows an increase in pulse width distortion. In other words, the greater the shift of the reception threshold voltage Vth away from the amplitude midline of the differential signal, the greater the pulse width distortion. For example, when Vth=H, the pulse width A at a high level time is much less than the pulse width B at a low level time. Such pulse width distortion becomes larger as the bit rate increases to a high value.

With reference again to FIG. 6, the waveform of the differential signal from a conventional system shows that the reception threshold voltage Vth in the high speed field is shifted away from the center of the differential signal, which indicates that the differential signal is susceptible to greater waveform distortion.

7. Other Embodiments

Although an embodiment of the present disclosure is described above in detail, various changes and modifications may also be applicable to the present disclosure.

Although the diodes D21, D22, D23, and D24 are used in the configuration for suppressing the amplitude of the ringing, i.e., as an amplitude suppressor to suppress ringing, in the above-mentioned embodiment, such configuration may be changed.

For example, one of the diodes in a series connection, i.e., one of D21 and D22, and one of D23 and D24 may be replaced with a resistor.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. Such changes, modifications, and summarized schemes are to be understood as being within the scope of the present disclosure as defined by appended claims.

What is claimed is:

1. A transmission circuit configured to connect to a transmission line and to transmit a differential signal, the transmission circuit comprising:
   a first transmitter configured to transmit the differential signal to the transmission line by switching between a drive state for supplying an electric power to the transmission line and a non-drive state for interrupting a supply of the electric power to the transmission line, according to a binary-represented transmission signal received by the first transmitter; and
   a second transmitter configured to transmit the differential signal to the transmission line by switching between a drive state for supplying an electric power to the transmission line and a non-drive state for interrupting a supply of the electric power to the transmission line, according to the binary-represented transmission signal and a permission signal received by the second transmitter, wherein
   the non-drive state of the second transmitter occurs in a dominant period when the first transmitter is in the drive state, and the drive state of the second transmitter occurs in a recessive period when the first transmitter is in the non-drive state, and wherein the second transmitter switching between the drive state and the non-drive state outputs the differential signal in the recessive period with a smaller amplitude and a reverse polarity relative to an amplitude and a polarity of the differential signal output in the dominant period.

2. The transmission circuit of claim 1, wherein
the transmission signal and the permission signal received by the transmission circuit are transmitted in a low-speed field and a high-speed field, and wherein the second transmitter is configured to transmit the differential signal when the transmission signal and the permission signal are transmitted in the high-speed field, and wherein a portion of the transmission signal transmitted in the low-speed field is transmitted at a predetermined speed, and wherein a portion of the transmission signal transmitted in the high-speed field is transmitted at a speed higher than the predetermined speed.

3. The transmission circuit of claim 2, wherein
the differential signal has a voltage level, the voltage level of the differential signal comparable against a reception threshold voltage to determine a signal level of the differential signal, wherein the reception threshold voltage is a midpoint of a differential signal waveform output when the transmission signal is transmitted in the high-speed field.

4. The transmission circuit of claim 2, wherein
the transmission signal received by the transmission circuit is transmitted according to a Controller Area Network with Flexible Date rate (CAN-FD) protocol, and wherein a portion of the transmission signal designated as an arbitration field signal is transmitted in the low-speed field, and wherein a portion of the transmission signal designated as a non-arbitration field signal is transmitted in the high-speed field.

5. The transmission circuit of claim 1, wherein
the transmission line includes a first signal line and a second signal line, and wherein
the transmission signal received by the transmission circuit has a first signal level and a second signal level, and wherein
the first transmitter includes:
a first switch connected at a position between a preset first potential and the first signal line;
a second switch connected at a position between a preset second potential and the second signal line, wherein the second potential is less than the first potential; and
a first driver circuit configured to control the first switch and the second switch when the transmission signal is in the first signal level, and wherein
the second transmitter includes:
a third switch connected at a position between the preset first potential and the second signal line;
a fourth switch connected at a position between the preset second potential and the first signal line;
a second driver circuit configured to control the third switch and the fourth switch when the transmission signal is in the second signal level; and
an amplitude suppressor configured to suppress the differential signal transmitted from the second transmitter.

6. The transmission circuit of claim 5, wherein
the amplitude suppressor is a diode, and wherein a diode is connected in series to each of the third switch and the fourth switch.

7. A transceiver comprising:
a transmission circuit configured to transmit a differential signal, the transmission circuit including
a first transmitter configured to transmit the differential signal to the transmission line by switching between a drive state for supplying an electric power to the transmission line and a non-drive state for interrupting a supply of the electric power to the transmission line, according to a binary-represented transmission signal received by the first transmitter, and
a second transmitter configured to transmit the differential signal to the transmission line by switching between a drive state for supplying an electric power to the transmission line and a non-drive state for interrupting a supply of the electric power to the transmission line, according to the binary-represented transmission signal and a permission signal received by the second transmitter; and
a reception circuit configured to receive the differential signal from the transmission line, wherein
the non-drive state of the second transmitter occurs in a dominant period when the first transmitter is in the drive state, and the drive state of the second transmitter occurs in a recessive period when the first transmitter is in the non-drive state, and wherein
the second transmitter switching between the drive state and the non-drive state outputs the differential signal in the recessive period with a smaller amplitude and a reverse polarity relative to an amplitude and a polarity of the differential signal output in the dominant period.

* * * * *